(12) United States Patent
Al-Amri et al.

(10) Patent No.: US 8,541,164 B2
(45) Date of Patent: Sep. 24, 2013

(54) SUB-WAVELENGTH LITHOGRAPHY VIA RABI OSCILLATIONS

(75) Inventors: Mohammad D. Al-Amri, Riyadh (SA); Zeyang Liao, College Station, TX (US); Muhammad Suhail Zubiary, College Station, TX (US)

(73) Assignees: The Texas A&M University System, College System, TX (US); King Abdulaziz City for Science and Technology, Riyadh (SA)

( * ) Notice: Subject to any disclaimer, the term of this patent is extended or adjusted under 35 U.S.C. 154(b) by 80 days.

(21) Appl. No.: 13/270,597

(22) Filed: Oct. 11, 2011

(65) Prior Publication Data

US 2013/0004899 A1    Jan. 3, 2013

Related U.S. Application Data

(60) Provisional application No. 61/503,036, filed on Jun. 30, 2011.

(51) Int. Cl.
*G03F 7/20* (2006.01)
(52) U.S. Cl.
USPC .......................................... 430/322; 430/394
(58) Field of Classification Search
USPC ................................................. 430/322, 394
See application file for complete search history.

(56) References Cited

PUBLICATIONS

Z. Liao, M. Al-Amri, and M.S. Zubairy, "Quantum Lithography beyond the Diffraction Limit via Rabi Oscillations", Phys. Rev. Lett. 105, 183601 (2010).
C. Williams et al., "Quantum Lithography: A non-computing application of quantum information", Inf. Forsch. Ent. 21, 73 (2006).
A. Boto et al., "Quantum Interferometric Optical Lithography: Exploiting Entanglement to Beat the Diffraction Limit", Phys. Rev. Left. 85, 2733 (2000).
M. D'Angelo, M.V. Chekhova, and Y. Shih, "Two-Photon Diffraction and Quantum Lithography", Phys. Rev. Lett. 87, 013602 (2001).
G. S. Agarwal, R.W. Boyd, E. M. Nagasako, and S. J. Bentley, "Comment on 'Quantum Interferometric Optical Lithography: Exploiting Entanglement to Beat the Diffraction Limit'", Phys. Rev. Left. 86, 1389 (2001).
A. Pe'er et al., "Quantum lithography by coherent control of classical light pulses", Opt. Express 12, 6600 (2004).
S. J. Bentley and R.W. Boyd, "Nonlinear optical lithography with ultra-high sub-Rayleigh resolution", Opt. Express 12, 5735 (2004).
P. R. Hemmer, A. Muthukrishnan, M. O. Scully, and M. S. Zubairy, "Quantum Lithography with Classical Light", Phys. Rev. Lett. 96, 163603 (2006).

(Continued)

*Primary Examiner* — Brittany Raymond
(74) *Attorney, Agent, or Firm* — Wong, Cabello, Lutsch, Rutherford & Brucculeri, LLP

(57) ABSTRACT

A sub-wavelength photolithographic method includes exposing a photoresist material to a stimulating electromagnetic source prior to further exposing the photoresist material to a dissociating electromagnetic source. The stimulating electromagnetic source induces Rabi oscillations in the photoresist material between a first molecular state and an excited molecular state. The subsequent exposure of the photoresist material to the dissociating electromagnetic source dissociates only those molecules that are in the excited state, altering the properties of the photoresist material in zones of excited state molecules. The resulting patterns therefore depend on the spatial distribution of the zones of excited state molecules induced by the stimulating electromagnetic source. The properties of the stimulating electromagnetic source are controlled to achieve a desired spatial distribution of zones of excited state molecules of the photoresist material.

20 Claims, 10 Drawing Sheets

(56) References Cited

PUBLICATIONS

Q. Sun, P. R. Hemmer, and M. S. Zubairy, "Quantum lithography with classical light: Generation of arbitrary patterns", Phys. Rev. A 75, 065803 (2007).

M. Kiffner, J. Evers, and M. S. Zubairy, "Resonant Interferometric Lithography beyond the Diffraction Limit", Phys. Rev. Lett. 100, 073602 (2008).

S. Pau, G. P. Watson, and O. Nalamasu, "Writing an arbitrary non-periodic pattern using interference lithography", J. Mod. Opt. 48, 1211 (2001).

P. Kok et al., "Quantum-interferometric optical lithography: Towards arbitrary two-dimensional patterns", Phys. Rev. A 63, 063407 (2001).

S. F. Fischer and A. Laubereau, "Dephasing Processes of Molecular Vibrations in Liquids", Chem. Phys. Lett. 35, 6 (1975).

P. C. Becker et al., "Optical Stark Effect in Organic Dyes Probed with Optical Pulses of 6-fs Duration", Phys. Rev. Lett. 60, 2462 (1988).

G. Donnert et al., "Macromolecular-scale resolution in biological fluorescence microscopy", Proc. Natl. Acad. Sci. U.S.A. 103, 11 440 (2006).

S.W. Hell and J. Wichmann, "Breaking the diffraction resolution limit by stimulated emission:stimulated-emission-depletion fluorescence microscopy", Opt. Lett. 19, 780 (1994).

Z. Liao, "Subwavelength photolithography via Rabi oscillations", Jun. 2011 presentation.

M.S. Zubairy, "Sub-wavelength lithography and microscopy", Jun. 2011 presentation.

SUB-WAVELENGTH LITHOGRAPHY VIA RABI OSCILLATIONS

CROSS REFERENCE TO RELATED APPLICATIONS

This Application claims priority to U.S. Provisional Application Ser. No. 61/503,036 entitled "Sub-wavelength Lithography via Rabi Oscillations" filed Jun. 30, 2011 and which is incorporated by reference in its entirety herein.

BACKGROUND

This disclosure relates generally to the field of photolithography. More particularly, but not by way of limitation, it relates to a sub-wavelength photolithographic technique that overcomes the diffraction limitations of traditional photolithography.

Photolithography is a critical step in the formation of the complex electronic circuitry that drives the modern devices (such as digital memory devices, video display devices, and digital imaging devices to name a few) to which we have become accustomed. The process of creating the semiconductor chips utilized by these modern devices typically involves several iterations of the photolithographic cycle.

Photolithography takes advantage of the altered properties of a light-sensitive substance known as a photoresist upon exposure to electromagnetic (EM) radiation. These altered properties of the photoresist material allow for the selective formation of various components of microelectronic circuits with features smaller than one micrometer. In a particular example of the traditional photolithographic process depicted in FIG. 1, for example, a photoresist 102 is applied to an insulating material 104 (such as silicon dioxide), which is itself disposed on a semiconductor material 106 (such as a silicon crystal), to form a substrate 108. The photoresist 102 is typically applied by a spin coating process in which a liquid solution of the photoresist 102 is applied to the insulating material 104 while the substrate 108 is rapidly spinning. The spin coating process ensures that the photoresist 102 is applied in a uniform, flat layer.

A reticle 110 corresponding to a desired pattern is subsequently placed between an electromagnetic (EM) source 112 and the photoresist 102 such that certain portions of the photoresist 102 are exposed 114 upon activation of the EM source 112 while other portions of the photoresist 102 are unexposed 116. While the particular example illustrated in FIG. 1 depicts a simple pattern for purposes of clarity, the photolithographic process can be utilized to create complex patterns with great precision.

As described above, the properties of exposed portion 114 of the photoresist 102 are altered based on exposure to EM source 112. For example, exposed portion 114 of the photoresist 102 may be soluble in a particular solvent while unexposed portions 116 may be insoluble in the same solvent. Consequently, at step 118, the exposed portion 114 of the photoresist 102 is selectively removed while the unexposed portions 116 of the photoresist 102 remain, creating an exposed portion 120 of insulating material 104. It should be noted that the photoresist depicted in FIG. 1 is what is known as a positive photoresist, because the exposed portions of the photoresist become more soluble than the unexposed portions. Negative photoresists, in which the exposed portions of the photoresist become less soluble than the unexposed portions, are also known and utilized.

At step 122, the exposed portion 120 of insulating material 104 is removed (e.g., etched) by a known process while the portions of insulating material 104 that are protected by the remaining photoresist 102 are not removed. Subsequently, the remaining photoresist 102 is removed (e.g., dissolved in a solvent in which even the unexposed portions 116 of photoresist 102 are soluble), leaving the substrate 108 with the desired pattern. Subsequent photolithographic cycles may be utilized to further pattern the substrate 108 to form desired circuitry. While the process illustrated in FIG. 1 depicts the usage of photolithography to selectively remove material (in this case exposed portion 120 of insulating material 104), the photolithographic process is equally applicable for the selective deposition of material. Thus, photolithography allows for the precise formation of microelectronic circuitry by the selective removal and deposition of materials on a substrate.

As the desire for smaller and more efficient electronic devices increases, there is a corresponding desire to form smaller patterns using photolithography to create the electrical circuitry that will drive these devices. It is well known, however, that diffraction limits the size of the features formed by traditional photolithography methods to approximately one half of the wavelength of the EM source 112 used to pattern the features according to the Rayleigh criterion. It would seem logical, therefore, to use an EM source 112 having a shorter wavelength. However, various problems arise with respect to shorter wavelength EM radiation. For example, as is well known, the wavelength of EM radiation is inversely proportional to the frequency of the EM radiation. Moreover, the frequency of EM radiation is directly proportional to the energy of the EM radiation. Thus, as wavelength decreases, frequency and energy increase. When insulating materials 104 such as silicon dioxide are exposed to photons with an energy greater than the band gap of the material, free electrons are released, thereby adversely affecting the insulating properties of the material. Furthermore, deep ultraviolet and x-ray radiation are significantly absorbed by traditional lenses and air such that they are not practical for usage in photolithography. There is thus a need to overcome the diffraction limit such that sub-wavelength patterns can be formed via photolithography.

Several attempts to achieve this goal have been proposed. A first interferometric approach requires entangled photon number states that are experimentally difficult to generate and sustain. A second approach, based on classical light pulses, achieves sub-wavelength resolution by correlating wave vector and frequency in a narrow band multi-photon detection process. This approach is based on an N-photon absorption process and can achieve a spatial resolution of $\lambda/(2N)$, where $\lambda$ is the wavelength of the light. The multiphoton transition of this approach, however, is accompanied by the need for high light field intensities, which makes an experimental realization of the technique impractical. Finally, a method based on dark state physics that would achieve the same $\lambda/(2N)$ resolution without the N-photon absorption process has been proposed. This scheme relies on the preparation of the system in a position dependent trapping state via phase shifted standing wave patterns and employs resonant atom-field interactions only. The method, however, requires multibeams and multilambda systems, and is therefore also not practically realizable.

There is thus a need for a photolithographic method that overcomes the diffraction limit and is realizable using current technology such that sub-wavelength patterns can be formed via photolithography.

DETAILED DESCRIPTION

Figure 1:
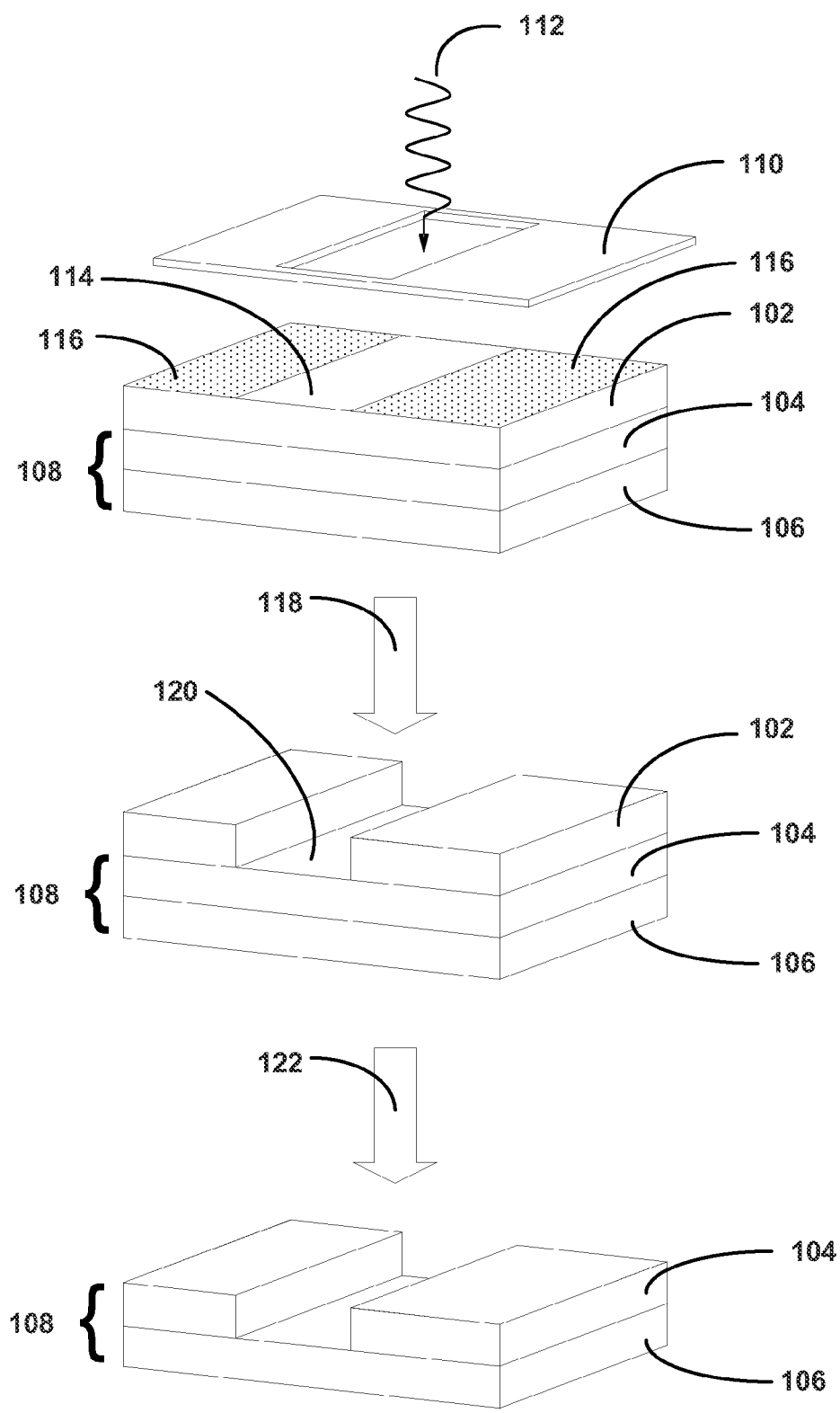
FIG. 1 is a perspective drawing illustrating the steps of a traditional photolithographic process.
Figure 2A:
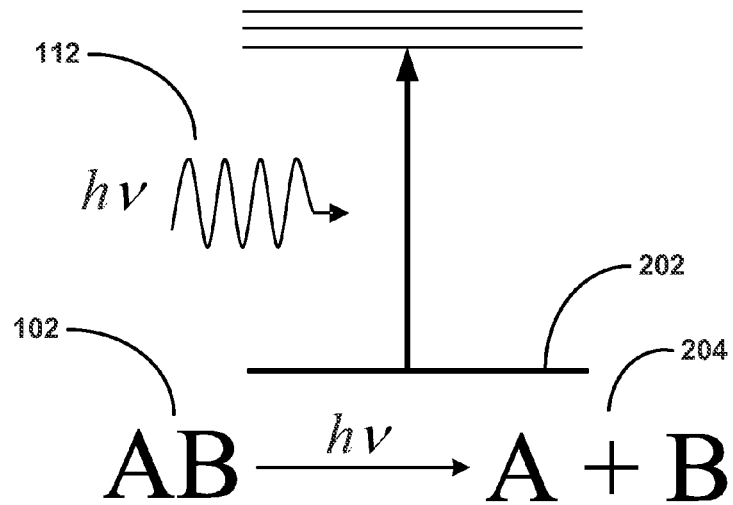
FIG. 2A is a state diagram illustrating the transition of a photoresist according to a traditional photolithographic process.
Figure 2B:
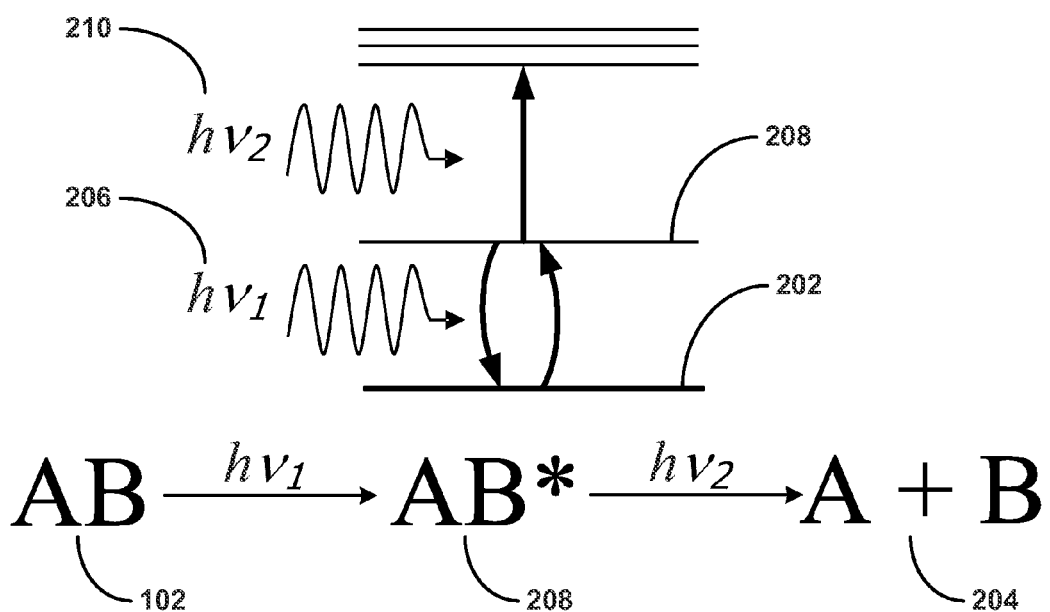
FIG. 2B is a state diagram illustrating the transition of a photoresist according to an embodiment of the sub-wavelength photolithographic technique.

Referring to FIGS. 2A and 2B, the general distinction between traditional photolithography and the sub-wavelength photolithographic technique of a particular embodiment of the invention is illustrated. FIG. 2A illustrates generally the transformation of a photoresist 102 in accordance with traditional photolithography as described above with respect to FIG. 1. Photoresist 102 (denoted as compound AB) is initially in a first state 202. Energy from EM source 112 initiates a reaction by which photoresist molecules 102 are excited from the first state 202 and react to form one or more reaction products 204 (denoted here as constituent A and constituent B) with different properties than that of photoresist 102. For example, constituent A and constituent B may both be soluble in a particular solvent while photoresist 102 (compound AB) is insoluble in the same solvent.

FIG. 2B, on the other hand, illustrates generally the transformation of a photoresist 102 in accordance with a particular embodiment of the sub-wavelength photolithographic technique disclosed herein. In the same manner as in the traditional technique described above with respect to FIG. 2A, photoresist 102 (compound AB) is initially in a first state 202. In the embodiment of the sub-wavelength photolithographic technique depicted in FIG. 2B, however, a first stimulating EM source 206 induces an oscillation between the first state 202 of the photoresist 102 and an excited state 208 (compound AB*) of the photoresist 102. In the presence of an oscillating field such as that created by first stimulating EM source 206, an atom or molecule such as photoresist 102 can oscillate between a first state and an excited state by cyclically absorbing and emitting a quantum of energy. Oscillation between the first state 202 and the excited state 208 occurs by what are known in the art as Rabi oscillations. After the first stimulating EM source 206 induces oscillations between the first state 202 and the excited state 208, a dissociating EM source 210 initiates a reaction by which photoresist molecules 102 in the excited state 208 are dissociated and react to form reaction products 204 while photoresist molecules in the first state 202 do not react. The resulting patterns of the photoresist therefore depend on the spatial distribution of zones of photoresist molecules 102 in the excited state 208 induced by the first stimulating EM source 206 at the time the dissociating EM source 210 is activated. Therefore, the sub-wavelength photolithographic technique does not require a reticle 110 to form desired patterns but is instead based on the spatial distribution of zones of excited state 208 molecules. However, as will be described in further detail below, a reticle 110 may be utilized in an embodiment of the sub-wavelength technique to isolate zones of excited state 208 molecules in desired regions of the photoresist 102.

The description and illustration of the hypothetical chemical reactions in FIGS. 2A and 2B are not intended to be limiting in any manner. For example, neither the traditional nor the sub-wavelength photolithographic technique disclosed herein is limited to reactions in which a photoresist reacts to form its constituent parts. Instead, FIGS. 2A and 2B are intended to illustrate the difference between traditional photolithography and the sub-wavelength photolithographic technique of a particular embodiment of the invention.

Figure 3:
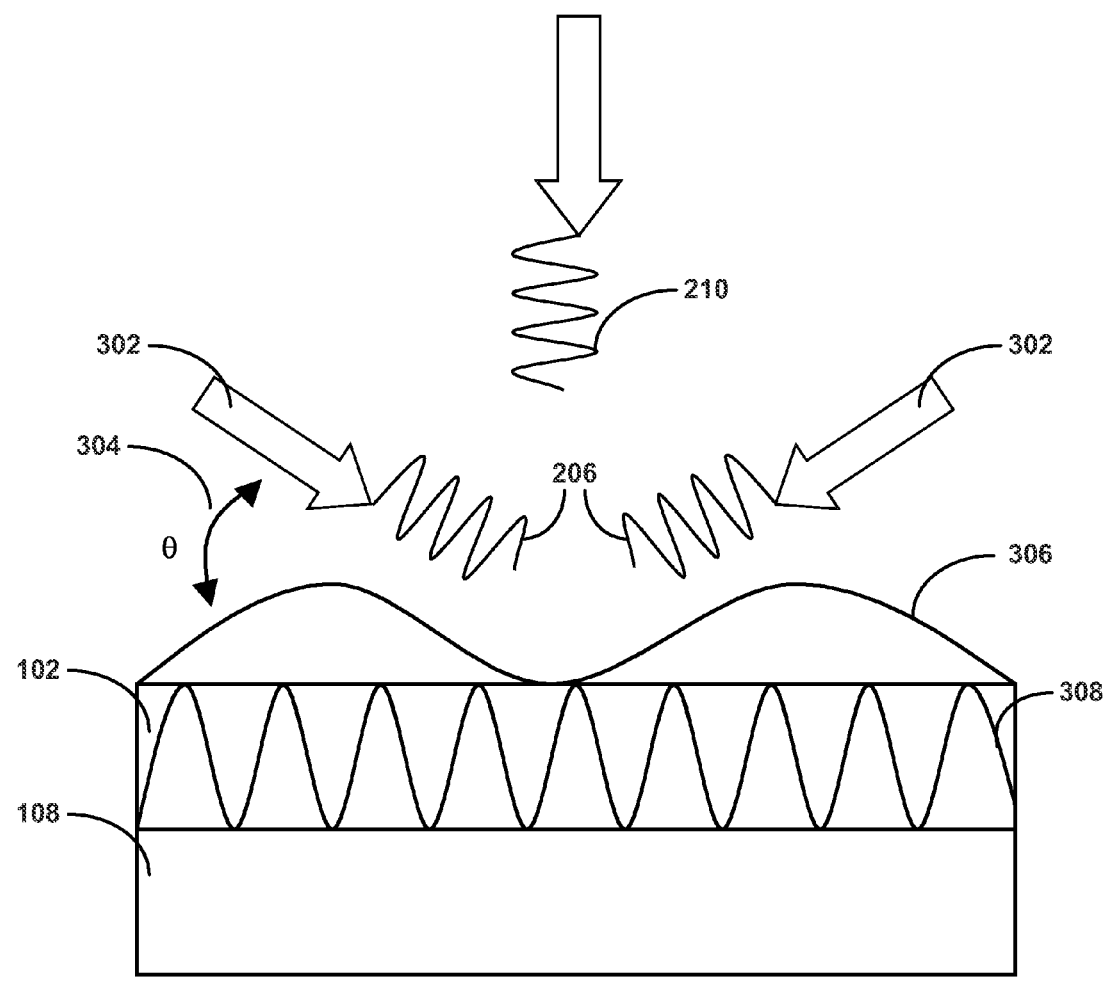
FIG. 3 is a block diagram of a photolithographic process according to an embodiment of the sub-wavelength photolithographic technique.
Figure 4:
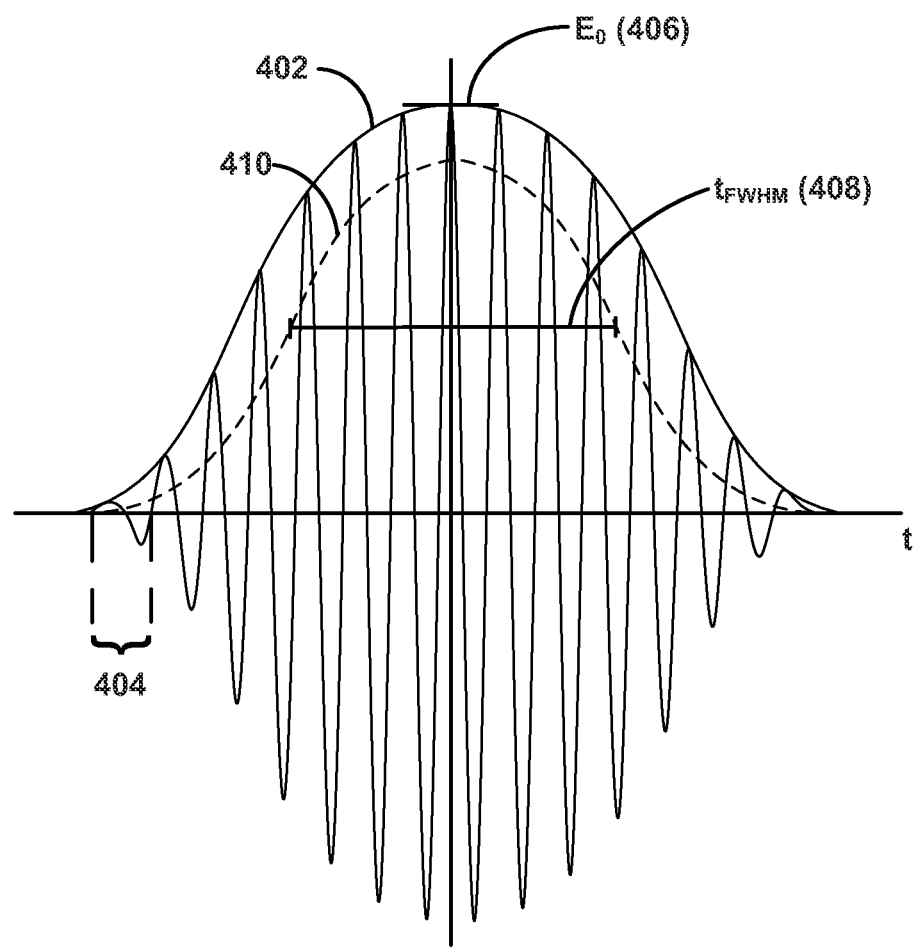
FIG. 4 is a graph illustrating properties of a stimulating pulse according to an embodiment of the sub-wavelength photolithographic technique.
Figure 5A:
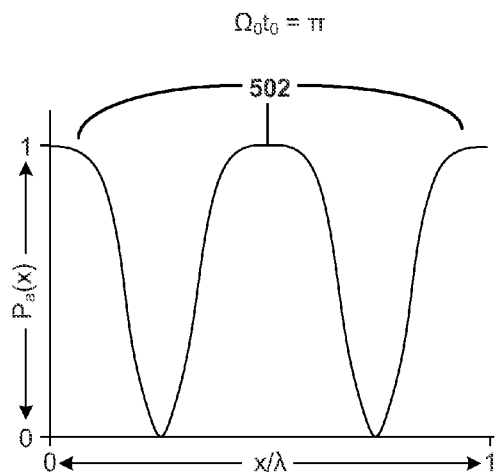
FIGS. 5A-5D illustrate the locations of excited state molecules of a photoresist according to varying properties of a stimulating pulse according to an embodiment of the sub-wavelength photolithographic technique.
Figure 5B:
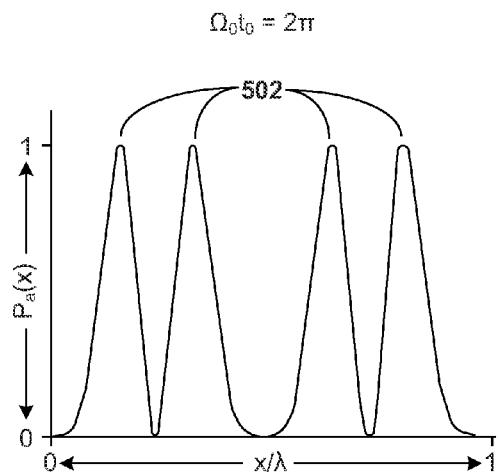
Figure 5C:
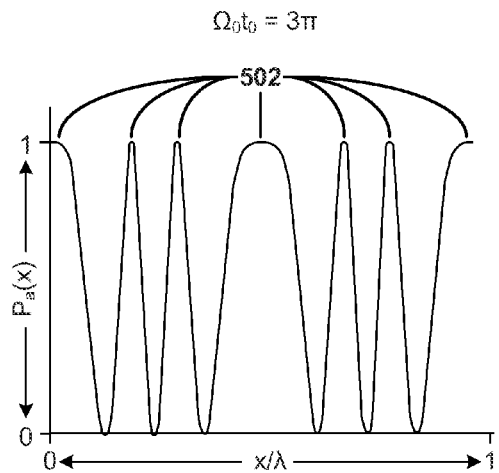
Figure 5D:
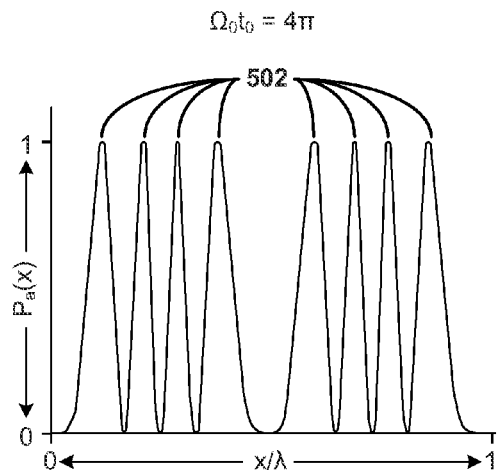

Referring to FIG. 3, in an embodiment of the sub-wavelength photolithographic method of FIG. 2B, first stimulating EM source 206 is implemented as two beams 302 directed on the photoresist 102 from opposite directions forming an angle θ 304 with the horizontal. In one embodiment, the two beams 302 may be formed by two lasers. In another embodiment, a beam splitter may form the two beams 302 from a single source. While the two beams are described as directed onto the photoresist 102 from opposite directions, in alternate embodiments, the two beams 302 may be directed onto the photoresist according to a different spatial arrangement. The two beams 302 of first stimulating EM source 206 are implemented as Gaussian pulses having the same frequency $v_1$ (the inverse of period 404), same maximal amplitude $E_0$ 406, and same duration (full width at half maximum of intensity) $t_{FWHM} = 2\sqrt{\ln 2}\,\sigma$ 408 (where σ is the standard deviation of the Gaussian pulse) as illustrated by the amplitude profile 402 and intensity profile 410 of the Gaussian pulses in FIG. 4.

The two Gaussian pulses from beams 302 interfere with one another to form a standing electric field 306 described by:

$$E(x, t) = 2E_0 \exp\left(-\frac{t^2}{2\sigma^2}\right)\cos(kx\cos\theta + \phi)\cos(v_1 t)$$

where φ is the phase difference between the two pulses and $v_1$ is resonant with the transition between the first state 202 and the excited state 208 of the photoresist 102. The frequency $v_1$ of first stimulating EM source 206 will therefore vary depending on the photoresist material. For a typical photoresist material, the frequency of first stimulating EM source 206 might range from approximately $7.5 \times 10^{14}$ Hz to $1.0 \times 10^{15}$ Hz, corresponding to a wavelength in the range of 300 to 400 nanometers (nm). For example, poly(methyl methacrylate) (PMMA) is sensitive to wavelengths of approximately 300 nm to 400 nm, diazonapthoquinone (DNQ) is sensitive to wavelengths of approximately 300 nm to 450 nm, and epoxy-based photoresist SU-8 is sensitive to a wavelength of approximately 365 nm.

While first stimulating EM source 206 may correspond to the visible or UV portions of the EM spectrum for many common photoresist materials, the frequency of first stimulating EM source 206 is entirely based on the properties of the photoresist 102 and may correspond to any portion of the EM spectrum. For example, in one embodiment, the sub-wavelength photolithographic technique may be utilized to generate a nanopattern using a microwave field. If a first state 202 and excited state 208 of photoresist 102 correspond to an energy difference of approximately 3 GHz and the photoresist has a coherence time on the order of 1 second, a microwave pulse of wavelength 10 cm and duration 0.1 s would induce Rabi oscillations between the two states. If the associated Rabi frequency was approximately 0.1 GHz, a spatial resolution on the order of 10 nm could be obtained.

Because the frequency $v_1$ is resonant with the transition between the first state 202 and the excited state 208 of photoresist 102, the standing electric field 306 will induce a Rabi oscillation 308 between the first state 202 and the excited state 208 in photoresist 102. The Rabi frequency corresponding to Rabi oscillation 308 generated by the standing electric field 306 is described by:

$$\Omega_R(x, t) = 2|\xi_{ba}|E_0 \exp\left(-\frac{t^2}{2\sigma^2}\right) \times \cos(kx\cos\theta + \phi)/\hbar$$

where $\xi_{ba}$ is the electric dipole moment between the first state 202 and the excited state 208 of photoresist 102 and $\hbar$ is Planck's constant/$2\pi$.

Therefore, the frequency of the Rabi oscillation 308 induced by the first stimulating EM source 206 can be expressed as a function of position and time based on the properties of the photoresist 102 and the properties of the pulse of first stimulating EM source 206. Moreover, according to the area theorem, the probability that a particular molecule of photoresist 102 at a particular position will be in the excited state 208 is given by:

$$P_a(x) = \frac{1 - \cos[\Omega_0 t_0 \cos(kx\cos\theta + \phi)]}{2}$$

where $$\Omega_0 = \frac{2|\xi_{ba}|E_0}{\hbar} \text{ and } t_0 = \sqrt{\frac{\pi}{2}\ln 2} \, t_{FWHM},$$

the derivation of which is set forth in greater detail in U.S. Provisional Application Ser. No. 61/503,036, which is incorporated herein by reference. From the above equation, it is apparent that the excited state 208 molecules of photoresist 102 are located in a double cosine pattern which is dependent on the amplitude 406 and duration 408 of the Gaussian pulses of first stimulating EM source 206.

For the simple case in which $\theta=\phi=0$, where $\Omega_0 t_0 \ll 1$ (i.e., Gaussian pulses of first stimulating EM source 206 are weak and/or short), a linear approximation of the above equation specifying the location of the excited state 208 molecules shows that the spatial resolution that can be achieved via the sub-wavelength photolithographic method is similar to that of the diffraction limit of traditional photolithography (i.e., $\sim\lambda/2$). However, as is illustrated in FIGS. 5A through 5D, as the amplitude 406 and/or duration 408 of the Gaussian pulses are increased, the concentration of zones 502 of excited state 208 molecules of photoresist 102 per unit position is increased. For example, in FIG. 5A, $\Omega_0 t_0 = \pi$, in FIG. 5B, $\Omega_0 t_0 = 2\pi$, in FIG. 5C, $\Omega_0 t_0 = 3\pi$, and in FIG. 5D, $\Omega_0 t_0 = 4\pi$. While the positional scale in each of FIGS. 5A through 5D is constant (i.e., one wavelength), as the amplitude 406 and/or duration 408 of the Gaussian pulses are increased, there are more zones 502 of excited state 208 molecules per unit position.

As noted above with respect to FIG. 2B, the subsequent exposure of photoresist 102 to dissociating EM source 210 will dissociate only those molecules of photoresist 102 in the excited state 208 to form reaction products 204 in zones 502 having altered properties from the unreacted photoresist 102. Therefore, as the amplitude 406 and/or duration 408 of the Gaussian pulses are increased, there is a corresponding ability to pattern smaller features. Moreover, for a given set of variables corresponding to the Gaussian pulses of the first stimulating EM source 206, the location of zones 502 of the excited state 208 molecules (and therefore the subsequently reacted portions of the photoresist 102) can be determined. As used herein, zones 502 in which the photoresist 102 is in an excited state refer to positional regions of the photoresist 102 in which the likelihood that a particular photoresist molecule is in an excited state 208 is higher than in other positional regions of the photoresist 102. Similarly, zones in which the photoresist 102 is in a first state refer to positional regions of the photoresist 102 in which the likelihood that a photoresist molecule is in a first state 202 is higher than in other positional regions of the photoresist 102.

Figure 6:
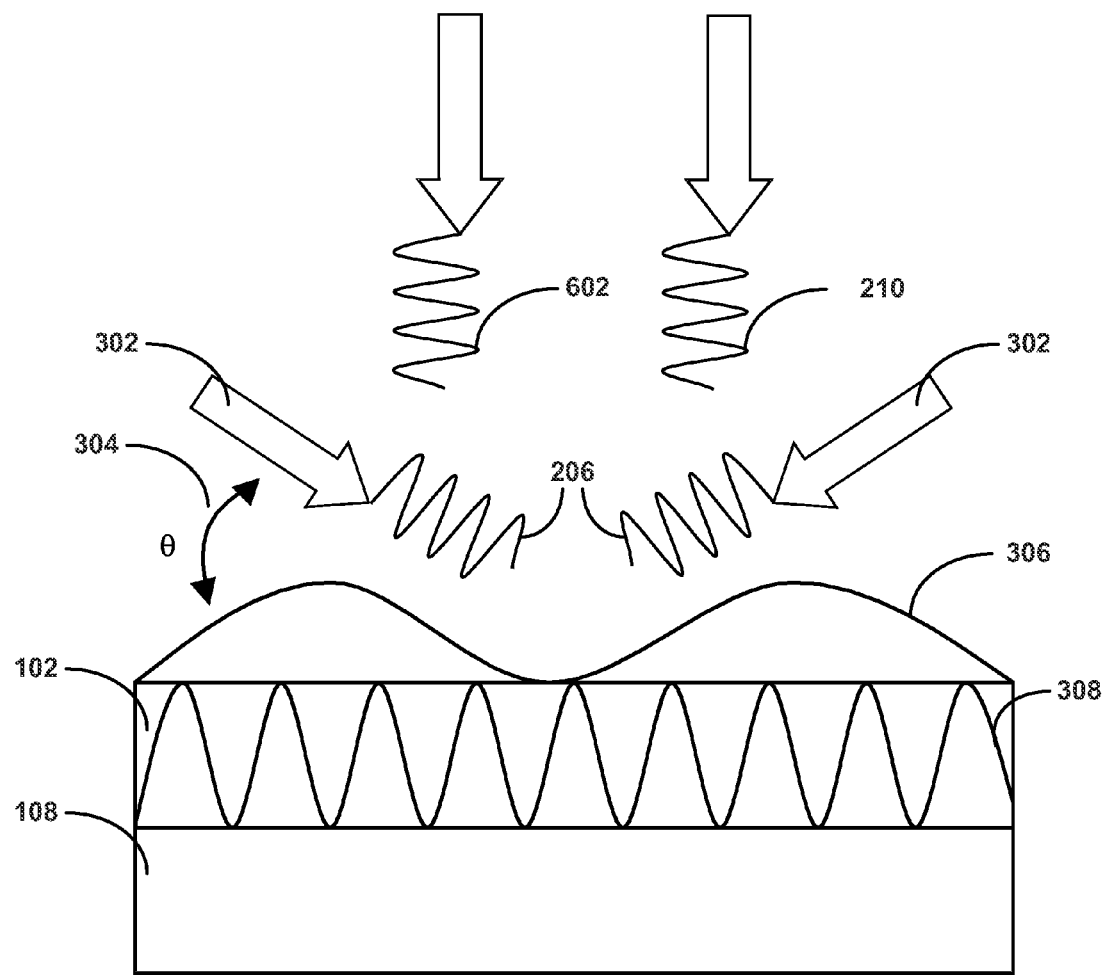
FIG. 6 is a block diagram of a photolithographic process according to an embodiment of the sub-wavelength photolithographic technique.

As is illustrated in FIGS. 5A through 5D, the excited state 208 molecules are not periodically distributed. There may therefore be a desire to identify and isolate regions of the photoresist 102 in which the location of zones 502 of excited state 208 molecules is periodic and to manipulate the spatial distribution and pattern of zones 502 of excited state 208 molecules within the isolated regions. In the embodiment illustrated in FIG. 6, in addition to first stimulating EM source 206 directed on the photoresist 102 from opposite directions at an angle θ 304, a background stimulating EM source 602 is directed on the photoresist 102 from a right angle. Again, in alternate embodiments, different spatial arrangements of first stimulating EM source 206 and background stimulating EM source 602 may be utilized. It is important to distinguish background stimulating EM source 602 from dissociating EM source 210. Background stimulating EM source 602 is utilized in a similar manner as first stimulating EM source 206 to induce oscillations in the photoresist between first state 202 and excited state 208. In one embodiment, background stimulating EM source 602 is implemented as a Gaussian pulse having the same frequency $v_1$ 404 and duration $t_{FWHM}$ 408 as the Gaussian pulses of the two beams 302 of first stimulating EM source 206. Background stimulating EM source 602 may be activated simultaneously with first stimulating EM source 206 such that the two beams 302 of first stimulating EM source 206 interfere to form a standing wave and the background stimulating EM source 602 forms a constant background. In one embodiment, a beam splitter may be utilized to form both beams 302 of first stimulating EM source 206 as well as background stimulating EM source 602 from a single laser beam or other EM source. As will be described in greater detail below, the amplitude $E_1$ of the Gaussian pulse of background stimulating EM source 602 may be manipulated to control the pattern of the zones 502 of excited state 208 molecules of photoresist 102.

The resulting electric field created by the Gaussian pulses of the two beams 302 of first stimulating EM source 206 and the Gaussian pulse of background stimulating EM source 602 is given by:

$$E(x, t) \cong [2E_0 k x \cos\theta + E_1] \exp\left(-\frac{t^2}{2\sigma^2}\right) \cos(v_1 t)$$

when $$\phi = \frac{\pi}{2}$$

and $n\pi - \epsilon \leq kx \cos\theta \leq n\pi + \epsilon$, where n is an integer and $\epsilon$ is a small number.

Figure 7:
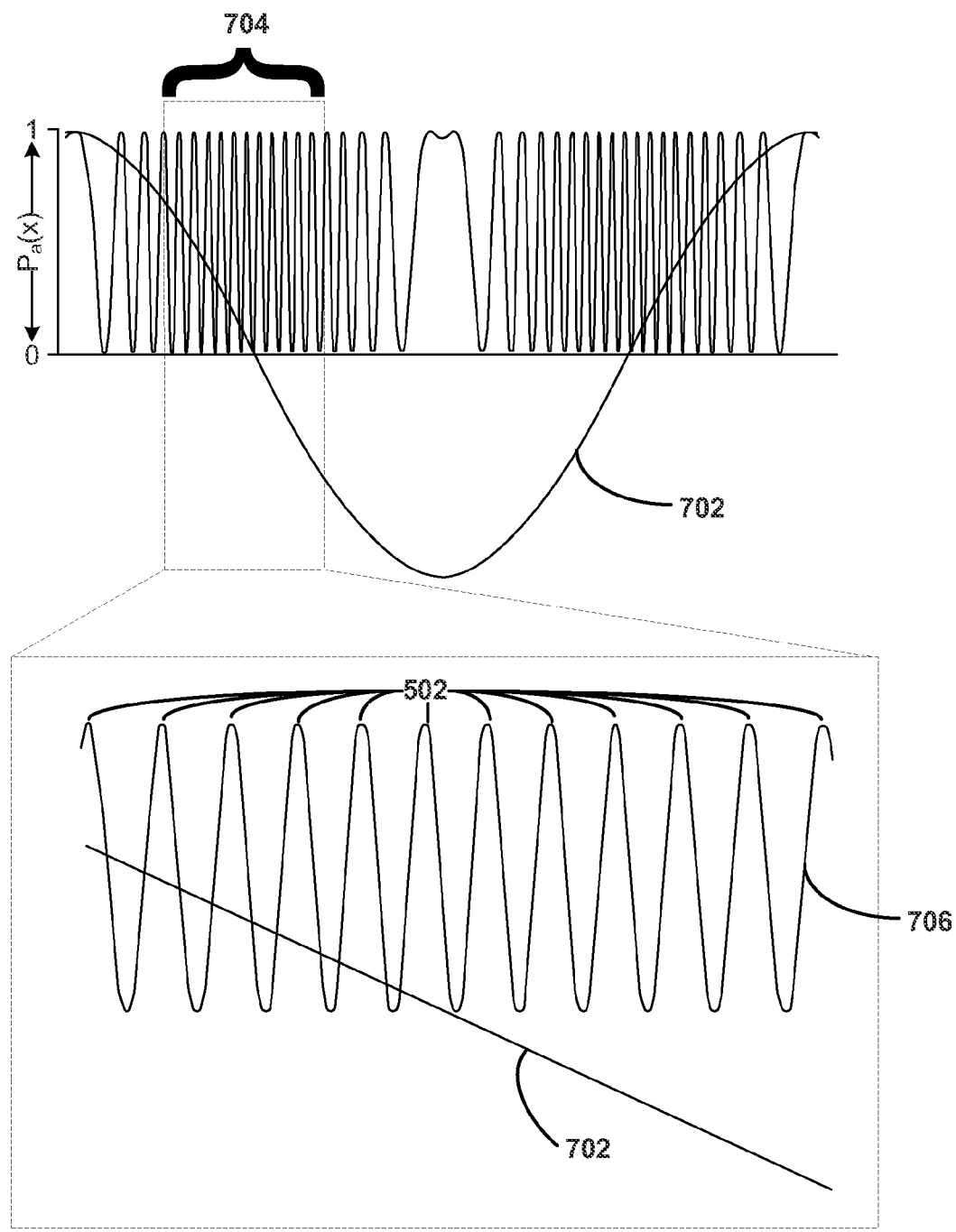
FIG. 7 is a graph illustrating the pattern of excited state molecules with respect to a particular stimulating pulse according to an embodiment of the sub-wavelength photolithographic technique.

The intensity gradient of the electric field 702 produced by this arrangement is approximately constant over a region 704 as illustrated in FIG. 7. The location of zones 502 of excited state 208 molecules of photoresist 102 corresponding to electric field 702 is shown at 706. As further illustrated in FIG. 7, zones 502 of excited state molecules 208 of photoresist 102 are periodically distributed within region 704. The pattern 706 of excited state 208 molecules within region 704 is given by:

$$P_a(x) = \frac{1 - \cos(Ax + B)}{2}$$

where $A = \Omega_0 t_0 k \cos\theta$, $B = \Omega_1 t_0$, and $\Omega_1 = |\xi_{ab} E_1/\hbar|$. Thus, coefficients A and B can be controlled by the amplitudes of the Gaussian pulses of first stimulating EM source 206 and background stimulating EM source 602 ($E_0$ and $E_1$, respectively) as well as the duration of the Gaussian pulses to achieve a desired periodic pattern within the region 704. For example, setting B=0 results in the location of excited state 208 molecules in the region 704 forming a cosine pattern while setting B=π/2 results in the location of excited state 208 molecules in the region 704 forming a sine pattern.

Region 704 is defined by $$\frac{n\pi - \epsilon}{k\cos\theta} \leq x \leq \frac{n\pi + \epsilon}{k\cos\theta}.$$

Accordingly, the region 704 over which a periodic pattern of zones 502 of excited state 208 molecules can be obtained is limited by the value of θ. Just by way of example, to generate a periodic pattern in a region 704 equivalent to 10λ, with n=0 and ε=π/4, cos θ=1/40. Moreover, the spatial resolution of the zones 502 of excited state 208 molecules based on the periodic pattern obtained in region 704 is defined by $\lambda_{eff} = \lambda/\Omega_0 t_0 \cos\theta$ where $\lambda_{eff}$ is the spatial resolution within region 704. Thus, based on the above example in which cos θ=1/40, to obtain a resolution of λ/10 in region 704, $\Omega_0 t_0$ would be equal to 400.

Figure 8:
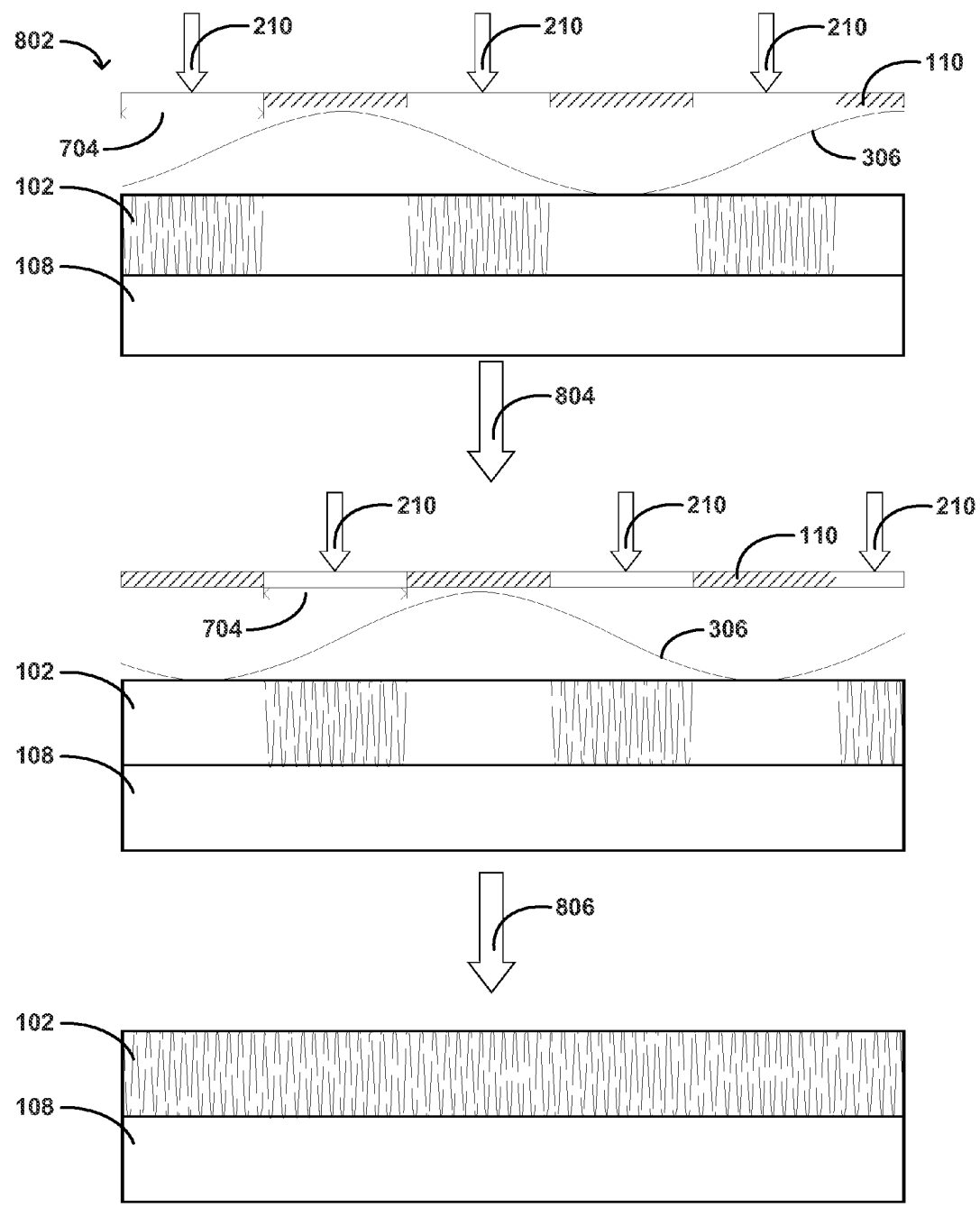
FIG. 8 is a block diagram illustrating the isolation of periodic patterns of excited state molecules of a photoresist according to an embodiment of the sub-wavelength photolithographic technique.

As the size of region 704 increases, larger amplitude Gaussian pulses from the two beams 302 of first stimulating EM source 206 are required to obtain the same spatial resolution of the zones 502 of excited state 208 molecules within the region 704. At some point, the power requirements to obtain such a result over a larger region 704 might become very large and impractical. As depicted in FIG. 8, however, a particular embodiment of the sub-wavelength photolithographic technique utilizes the ability to shift the phase of the electric field 306 resulting from the Gaussian pulses of first stimulating EM source 206 and background stimulating EM source 602 in conjunction with a reticle 110 to isolate the portions of the photoresist 102 that are exposed to dissociating source 210 to those portions of the photoresist 102 in which the gradient of intensity of the electric field is constant. In these isolated regions, the spatial distribution of the zones 502 of excited state 208 molecules is periodic. In a first step 802, an electric field 306 is generated in the manner described above with respect to FIGS. 3 and 6. The system variables (such as pulse amplitude and pulse duration) are selected such that the gradient of intensity of electric field 306 is approximately constant in desired regions 704, thereby inducing a periodic pattern of zones 502 of excited state 208 molecules of photoresist 102 having the desired spatial resolution within regions 704. Subsequently, dissociating EM source 210 is activated. A reticle 110 exposes only those portions of photoresist 102 corresponding to regions 704 to dissociating EM source 210 and shields the portions of the photoresist not corresponding to regions 704 (in which the distribution of zones 502 of excited state 208 molecules is not periodic) from dissociating EM source 210. As has been described, dissociating EM source 210 is of an energy such that only those molecules of photoresist 102 that are in the excited state 208 at the time of exposure to dissociating EM source 210 dissociate to form reaction products 204. Thus, within the exposed regions of photoresist 102 corresponding to regions 704, a periodic pattern having a sub-wavelength spatial resolution is created.

Thereafter, at step 804, the properties of the Gaussian pulses used to generate electric field 306 are altered such that the phase of the electric field 306 is shifted. As demonstrated by a comparison of the electric field 306 generated in steps 802 and 804, the new regions 704 of electric field 306 over which the gradient of intensity is approximately constant is shifted in step 804 to correspond to the portions of the photoresist 102 that were not exposed to dissociating EM source 210 in step 802. Reticle 110 is also altered to correspond to new regions 704 such that new regions 704 are exposed to dissociating EM source 210. Dissociating EM source 210 is then activated to form the sub-wavelength pattern in the portions of photoresist 102 that were not exposed in step 802. Therefore, as illustrated in step 806, a desired periodic sub-wavelength pattern can be formed over a large region of photoresist 102 with the same power requirements as required to form the same pattern over a smaller region by exposing only the regions in which the pattern of excited state 208 molecules is periodic to dissociating EM source 210 and repeating the process after shifting the regions.

Each of the above embodiments has described one-dimensional applications. As will be described below, the disclosed photolithographic technique can be expanded to a two-dimensional application. Moreover, it should be noted that the described one-dimensional applications can be repeated sequentially to form two-dimensional patterns on a substrate. For example, the one-dimensional patterns could be formed on a substrate and the substrate could be subsequently shifted before repeating the process to form desired two-dimensional patterns on the substrate.

Figure 9:
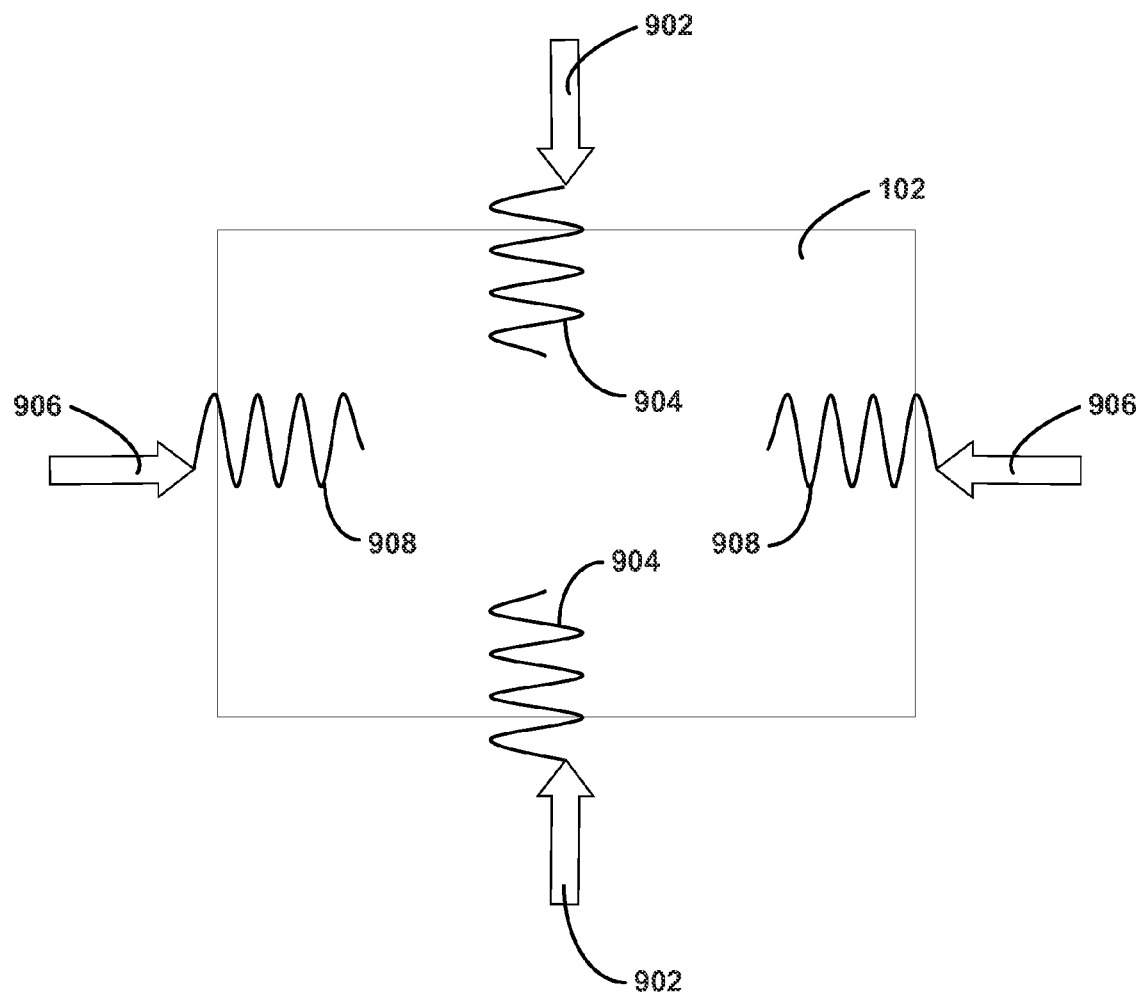
FIG. 9 is a block diagram of a two-dimensional photolithographic process according to an embodiment of the sub-wavelength photolithographic technique.

Referring to FIG. 9, a top side view of a portion of a photoresist 102 illustrates an embodiment of the photolithographic technique that generates two-dimensional patterns. Just as described above with respect to FIGS. 3 and 6, beams are directed on the photoresist from an angle θ (not shown) with the surface of the photoresist 102. However, in the depicted two-dimensional embodiment, there is a first pair of opposing beams 902 of first stimulating EM source 904 and a second pair of opposing beams 906 of second stimulating EM source 908. The opposing beams 902 and 906 are depicted as perpendicular to each other, however, other spatial arrangements may also be utilized. Just as described above, the opposing beams 902 and 906 may be implemented as Gaussian pulses. The Rabi oscillations induced in the photoresist 102 by the opposing beams 902 and 906 will form zones of excited state 208 molecules over a two-dimensional area. As further described above, a background stimulating EM source (not shown) directed on the photoresist 102 may be implemented as a Gaussian pulse to provide a constant background electric field over the two-dimensional area. Furthermore, a dissociating EM source (not shown) may be activated to dissociate the excited state 208 molecules of photoresist 102 to form a desired pattern over the two-dimensional area.

The location of excited state 208 molecules over a two-dimensional region $\lambda \times \lambda$ can be simulated by the truncated Fourier series:

$$f(x, y) \approx$$

$$\sum_{m=0}^{M} \sum_{n=0}^{N} \left\{ a_{mn} \cos\left[ \frac{\sqrt{m^2+n^2}}{\cos(\theta)} \cos\left[ \frac{2\pi\cos(\theta)}{\lambda} \frac{(mx+ny)}{\sqrt{m^2+n^2}} + \frac{\pi}{2} \right] \right] + b_{mn} \right.$$

$$\cos\left[ \frac{\sqrt{m^2+n^2}}{\cos(\theta)} \cos\left[ \frac{2\pi\cos(\theta)}{\lambda} \frac{(mx-ny)}{\sqrt{m^2+n^2}} + \frac{\pi}{2} \right] \right] +$$

$$c_{mn} \sin\left[ \frac{\sqrt{m^2+n^2}}{\cos(\theta)} \cos\left[ \frac{2\pi\cos\theta}{\lambda} \frac{(mx+ny)}{\sqrt{m^2+n^2}} + \frac{\pi}{2} \right] \right] +$$

$$\left. d_{mn} \sin\left[ \frac{\sqrt{m^2+n^2}}{\cos(\theta)} \cos\left[ \frac{2\pi\cos(\theta)}{\lambda} \frac{(mx-ny)}{\sqrt{m^2+n^2}} + \frac{\pi}{2} \right] \right] \right\}.$$

Therefore, the location of excited state 208 molecules in the two-dimensional area can be approximated by a Fourier series having four components. In the described embodiment, for the first and third components, the pulses are directed from directions $(m\hat{x}+n\hat{y})/\sqrt{m^2+n^2}$, and for the second and fourth components, the pulses are directed from directions $(m\hat{x}-n\hat{y})/\sqrt{m^2+n^2}$, with $\Omega_0 t_0 = \sqrt{m^2+n^2}/\cos(\theta)$. Based on this approximation of the location of excited state 208 molecules over the two-dimensional area, it is possible to pattern arbitrary features such as alphanumeric characters using a sequence of pulses. For example, if M=N=15, there are 15×15×4 Fourier components. For each component, there are four pulses (stimulating pulses from beams 902 and 906, background stimulating pulse, and dissociating pulse). Thus, with M=N=15, an arbitrary pattern can be printed in a $\lambda \times \lambda$ two-dimensional region with 3600 pulses. Obviously, the resolution of the desired pattern can be increased with increased values of M and N or decreased with decreased values of M and N.

Figure 10:
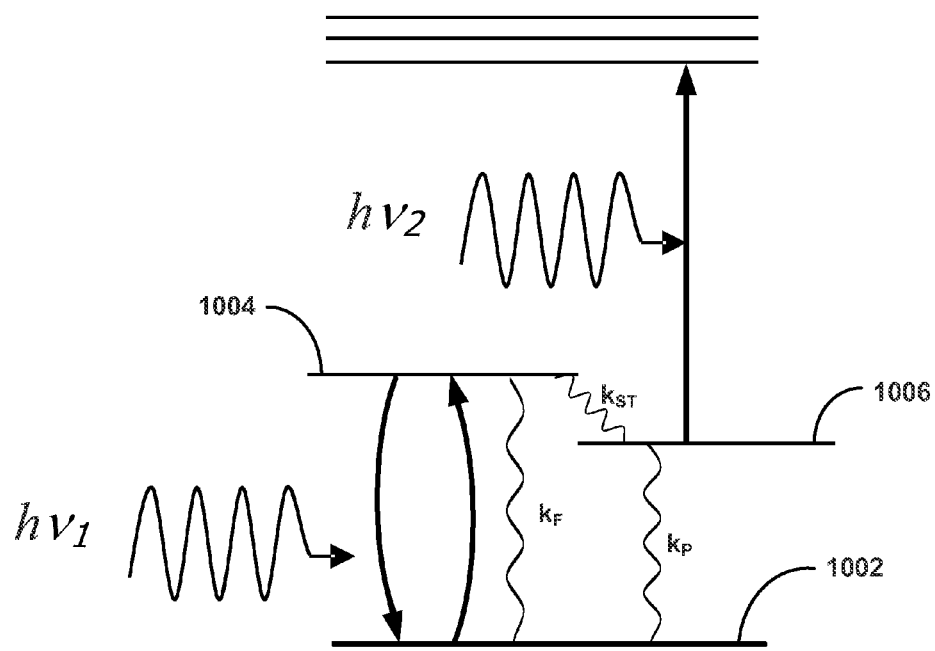
FIG. 10 is a state diagram illustrating the quantum properties of a photoresist according to an embodiment of the sub-wavelength photolithographic technique.

It is important to note that the quantum properties of photoresist 102 play an important role in the sub-wavelength photolithographic method disclosed herein. FIG. 10 depicts a state energy diagram for a typical photoresist. States 1002 and 1004 represent the ground singlet state and the first excited singlet state, respectively. State 1006 represents the first excited triplet state. Because the transition between the singlet state and the triplet state is dipole forbidden, the state diagram is essentially equivalent to the two-level system described with respect to FIG. 2B. $K_F$ represents the fluorescence decay rate from state 1004 to 1002, $K_P$ represents the phosphorescence decay rate from state 1006 to 1002, and $K_{ST}$ represents the intersystem crossing rate from state 1004 to 1006. To induce Rabi oscillations, the system should stay coherent (i.e., in an excited quantum state). A typical decoherence time $\tau$ is approximately 1-5 picoseconds (ps) at room temperature due to interactions between neighboring molecules. To realize the disclosed sub-wavelength photolithographic technique, the requirements for these parameters are $t_0 \sim \tau$ and $K_{ST} \gg K_F \gg K_P$. Given these parameters, the lifetime of state 1006 (or phosphorescence time) is long. Within the phosphorescence time, dissociating EM source 210 is activated to dissociate the molecules in state 1006. By way of example, for 1-bromonapthalene, $K_F \sim 10^6$ Hz, $K_{ST} \sim 10^9$ Hz, and $K_P \sim 30$ Hz. Based on the equations set forth above, to generate a pattern with a spatial resolution of $\lambda/10$ over a region of $10\lambda$, it would be sufficient to choose $t_0 = 5$ ps and $\Omega_0 = 8 \times 10^{13}$ Hz. The corresponding peak power, $E_0$, would be 2.17 GW/cm². The lifetime of state 1006 for 1-bromonapthalene is approximately 30 milliseconds (ms), which provides a sufficient amount of time to activate dissociating EM source 210.

It should further be noted that the decoherence time, $\tau$, of the photoresist 102 is an important factor in the sub-wavelength photolithographic technique. While the spatial resolution of the excited state 208 molecules is not affected by the decoherence time for a given set of system variables, visibility is decreased with decreasing decoherence time (i.e., the spatial distribution of zones of excited state 208 molecules is the same but the likelihood that a given molecule in such a zone is actually in excited state 208 is less than that in which decoherence time is ignored). As decoherence time decreases, a shorter stimulating EM source pulse of greater power is required to achieve the same spatial resolution and visibility.

It is to be understood that the above description is intended to be illustrative, and not restrictive. For example, the above-described embodiments may be used in combination with each other. Many other embodiments will be apparent to those of skill in the art upon reviewing the above description. The scope of the invention therefore should be determined with reference to the appended claims, along with the full scope of equivalents to which such claims are entitled.

What is claimed is:

1. A photolithographic method, comprising:
   directing two or more first electromagnetic source pulses on a photoresist material, the two or more first electromagnetic source pulses interfering to induce oscillations in the photoresist material by which a first plurality of zones of the photoresist material are in a first state and a second plurality of zones of the photoresist material are in an excited state; and
   exposing the photoresist material to a second electromagnetic source, wherein the second electromagnetic source initiates a reaction of the second plurality of zones but does not initiate a reaction of the first plurality of zones.

2. The photolithographic method of claim 1, wherein the oscillations in the photoresist material are Rabi oscillations.

3. The photolithographic method of claim 1, wherein the two or more first electromagnetic source pulses are Gaussian pulses.

4. The photolithographic method of claim 3, wherein the Gaussian pulses have the same amplitude and duration.

5. The photolithographic method of claim 1, wherein the two or more first electromagnetic source pulses are of a same frequency.

6. The photolithographic method of claim 5, wherein the frequency is resonant with an energy difference between the first state and the excited state of the photoresist material.

7. The photolithographic method of claim 1, wherein the second plurality of zones are disposed over a two dimensional region of the photoresist material.

8. The photolithographic method of claim 1, wherein the photoresist material is exposed to the second electromagnetic source within a phosphorescence time of the photoresist material.

9. The photolithographic method of claim 1, wherein the two or more first electromagnetic source pulses are laser pulses.

10. A photolithographic method, comprising:
    directing two pulses of a stimulating electromagnetic source on a photoresist material, the pulses forming a standing electric field that induces one or more zones of the photoresist material into an excited state; and
    exposing the photoresist material to a dissociating electromagnetic source, wherein the dissociating electromagnetic source initiates a reaction of the photoresist material only in the one or more zones of the photoresist material that are in the excited state.

11. The photolithographic method of claim 10, wherein the two pulses of the stimulating electromagnetic source are Gaussian pulses.

12. The photolithographic method of claim 11, wherein the Gaussian pulses have the same amplitude and duration.

13. The photolithographic method of claim 10, wherein the two pulses of the stimulating electromagnetic source are of a same frequency.

14. The photolithographic method of claim 13, wherein the frequency is resonant with an energy difference between a first state and the excited state of the photoresist material.

15. The photolithographic method of claim 10, wherein the photoresist material is exposed to the dissociating electromagnetic source within a phosphorescence time of the photoresist material.

16. The photolithographic method of claim 10, wherein the two pulses of the stimulating electromagnetic source are laser pulses.

17. The photolithographic method of claim 10, wherein the two pulses of the stimulating electromagnetic source are from opposite directions.

18. The photolithographic method of claim 17, wherein the two pulses of the stimulating electromagnetic source are directed on to the photoresist material from a same angle with respect to a plane of the photoresist material.

19. The photolithographic method of claim 10, further comprising a third pulse of the stimulating electromagnetic source that provides a constant background to the standing electric field.

20. The photolithographic method of claim 19, wherein an amplitude of the third pulse of the stimulating electromagnetic source alters a location of the one or more zones of the photoresist material that are in the excited state.

* * * * *